United States Patent
Massabki et al.

(10) Patent No.: US 7,340,705 B1
(45) Date of Patent: Mar. 4, 2008

(54) IN-CIRCUIT DEVICE, SYSTEM AND METHOD TO PARALLELIZE DESIGN AND VERIFICATION OF APPLICATION-SPECIFIC INTEGRATED CIRCUITS ("ASICS") HAVING EMBEDDED SPECIALIZED FUNCTION CIRCUITS

(75) Inventors: Elie H. Massabki, San Carlos, CA (US); Jay Sherman Hidy, Saratoga, CA (US)

(73) Assignee: ChipX, Inc., Santa Clara, CA (US)

( * ) Notice: Subject to any disclaimer, the term of this patent is extended or adjusted under 35 U.S.C. 154(b) by 229 days.

(21) Appl. No.: 11/229,331

(22) Filed: Sep. 16, 2005

(51) Int. Cl.
*G06F 17/50* (2006.01)
(52) U.S. Cl. ............................ 716/5; 716/17
(58) Field of Classification Search .................... 716/1, 716/4, 5, 17
See application file for complete search history.

(56) References Cited

U.S. PATENT DOCUMENTS 6,522,985 B1 * 2/2003 Swoboda et al. ........... 702/117

\* cited by examiner

*Primary Examiner*—Thuan Do
(74) *Attorney, Agent, or Firm*—Cooley Godward Kronish LLP

(57) ABSTRACT

An in-circuit design and verification device, system and method are disclosed for cooperatively designing and verifying application-specific integrated circuit device prior to fabrication by emulating logical and specialized functions. By emulating specialized circuits of the ASIC, an in-circuit design and verification-device can advantageously detect errors that are not generally detectable by conventional techniques for verifying ASIC designs. In one embodiment, an in-circuit design and verification system includes programmable logic configured to emulate on-chip logic of an ASIC as well as a specialized function circuit configured to emulate a specialized function that the programmable logic cannot emulate. The in-circuit design and verification system also includes an emulation interface configured to exchange signals between the configured programmable logic and the specialized function circuit during in-circuit design and verification. The configured programmable logic and the specialized function circuit thus cooperate to emulate the ASIC.

27 Claims, 6 Drawing Sheets

IN-CIRCUIT DEVICE, SYSTEM AND METHOD TO PARALLELIZE DESIGN AND VERIFICATION OF APPLICATION-SPECIFIC INTEGRATED CIRCUITS ("ASICS") HAVING EMBEDDED SPECIALIZED FUNCTION CIRCUITS

BRIEF DESCRIPTION OF THE INVENTION

This invention relates generally to the design and test of integrated circuits, and more particularly, to an in-circuit device, system and method for cooperatively designing and verifying application-specific integrated circuits ("ASICs") that include embedded circuits to provide specialized functions that otherwise cannot be adequately implemented using configurable logic alone.

BACKGROUND OF THE INVENTION

ASICs includes general circuits, such as logic, memory, and input/output ("I/O") ports, it also includes a specialized function circuit to implement a special function that the circuits cannot perform. For instance, the specialized function circuit might implement analog or mixed analog/digital circuitry, whereas the circuits might be limited to only digital circuits. In other cases, the specialized function circuit can implement a Peripheral Component Interconnect Express ("PCIe") physical layer ("PHY"), or any other complex, highly dense circuit.

One drawback to providing the specialized function circuit is that current in-circuit verification techniques are generally not comprehensive enough to emulate the functionality of the specialized function circuit in a target circuit (i.e., for a specific application). In particular, most conventional in-circuit verification techniques limit verification to the emulation of the functionalities provided by the circuits of an ASIC, thereby neglecting verification of the specialized function circuit and its interaction with the circuits. This can leave ASICs vulnerable to undetected errors. Some conventional approaches verify the design of ASICs by applying stimuli from a software-based simulator to an ASIC and the specialized function circuit. In this case, the functionality of ASIC is modeled in software. Typically, the stimuli mimic the functionality of a target circuit. Although functional, software-based simulators lack the capabilities to thoroughly test real-world applications, especially in their native environments. In practice, the amount of computer time used for software simulation limits the degree to which the design is verified. Another drawback is that normal design verification processes omit in-circuit emulation and/or verification as a part of the suite of tests in design verification. Without in-circuit verification, the problem of transferring undetected errors into a fabricated ASIC is exacerbated by the lack of exhaustive simulations.

FIG. 1 is a conventional process flow 100 for verifying designs in ASICs prior to fabrication of a device. A designer creates a design by establishing a hardware description language ("HDL") description of that design in, for example, a register transfer language ("RTL") at 101. The conventional flow is as follows: initial RTL is generated at 101, with subsequent test bench simulation performed at 104. If bugs are found at 115, then flow 100 iterates (i.e., regenerates) RTL and performs additional simulations. When bugs are not found, then flow 100 moves to 105 at which place and route is performed, followed by static timing analysis at 106. Note that timing is not met at 107, then flow 100 iterate RTL back at 101. A drawback to flow 100 is that test bench simulations at 104, as well as other software-based simulators, cannot readily detect errors that otherwise might be detectable during testing in real-time applications. Another drawback of relying on testbench verification is that there are combinations of inputs that are too numerous to test. Regardless of the uncertainties on how specialized function circuits and other ASIC circuits will interact collectively or individually in a real-time application, conventional flow 100 moves to 108. Here, an ASIC device is fabricated at 108. It is not until after fabrication that errors arise that otherwise would have been detectable by in-circuit verification. Consequently, additional resources, efforts, time and costs must be invested to rectify those errors found in the first silicon version of the device.

In view of the foregoing, it would be desirable to provide an in-circuit design and verification device, system and method that minimize the above-mentioned drawbacks, thereby facilitating expeditious design verification of ASIC devices.

SUMMARY OF THE INVENTION

An in-circuit design and verification device, system and method are disclosed for emulating logical and specialized functions to cooperatively design and verify an application-specific integrated circuit device prior to fabrication, whereby the design and verification are performed in-circuit. Further, by emulating specialized circuits of the ASIC, an in-circuit design and verification device can advantageously detect errors that are not generally detectable by conventional techniques for verifying the design of an ASIC device. In one embodiment, a method emulates an embedded specialized function circuit for an ASIC device. In particular, the method can include configuring programmable logic to initiate a specialized function to generate a response from a target system. In addition, the method provides for verifying whether the response from the target system matches an expected response. The programmable logic is reconfigured to alter the response to match the expected response. The description can include a hardware design language ("HDL"), such as RTL. In a specific embodiment, the method forms an interface between the programmable logic in a first integrated circuit and the embedded specialized function circuit in a second integrated circuit. In one embodiment, an in-circuit design and verification device emulates a specialized function circuit for an ASIC to verify that the specialized function circuit and the logic of programmable logic operate in compliance with a Peripheral Component Interconnect Express ("PCI Express") standard. In another embodiment, an in-circuit design and verification system includes programmable logic configured to emulate logic of an ASIC as well as a specialized function circuit configured to emulate a specialized function, which the programmable logic cannot emulate. The in-circuit design and verification system also includes an emulation interface configured to exchange signals between the programmable logic and the specialized function circuit during in-circuit design and verification. The programmable logic and the specialized function circuits thus cooperate to emulate the ASIC.

Advantageously, an exemplary in-circuit design and verification system can greatly reduce the risk of errors that otherwise would be transferred into the fabricated ASIC. Specifically, in-circuit design and verification system detects errors that are not generally detectable by conventional techniques for verifying designs of ASIC devices, such as those techniques that include the use of traditional software-based simulators. Also, the in-circuit design and verification system can emulate the specialized (i.e., non-logical) functionality of specialized function circuit that programmable logic cannot emulate. The in-circuit design and verification system desirably provides designers of ASICs with a tool for verifying operation of a specialized function circuit that has already been certified to comply with requirements, thereby foregoing a need for subsequent compliance testing. Otherwise, the designer might have to expend efforts to comply with predetermined quality metrics (e.g., minimal levels of performance set forth in a standard or specification), as do those designers using any ASIC technology. Further, an in-circuit design and verification system advantageously provides an improved design verification flow, for example, prior to fabrication of an ASIC device. This minimizes risks of committing resources, such as NRE costs and cycle time, to reap the benefits of ASIC devices. In some embodiments, an emulator interface verifies cooperative communications between a specialized function circuit and programmable logic to emulate a run time interface, through which cooperative communications usually pass during run mode between on-chip logic and the special circuit. Emulation of a run time interface is beneficial, in whole or in part, to predict how functions will behave in a post-fabricated target ASIC.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings. Note that most of the reference numerals include one or two left-most digits that generally identify the figure that first introduces that reference number.

DETAILED DESCRIPTION OF EXEMPLARY EMBODIMENTS

Figure 1:
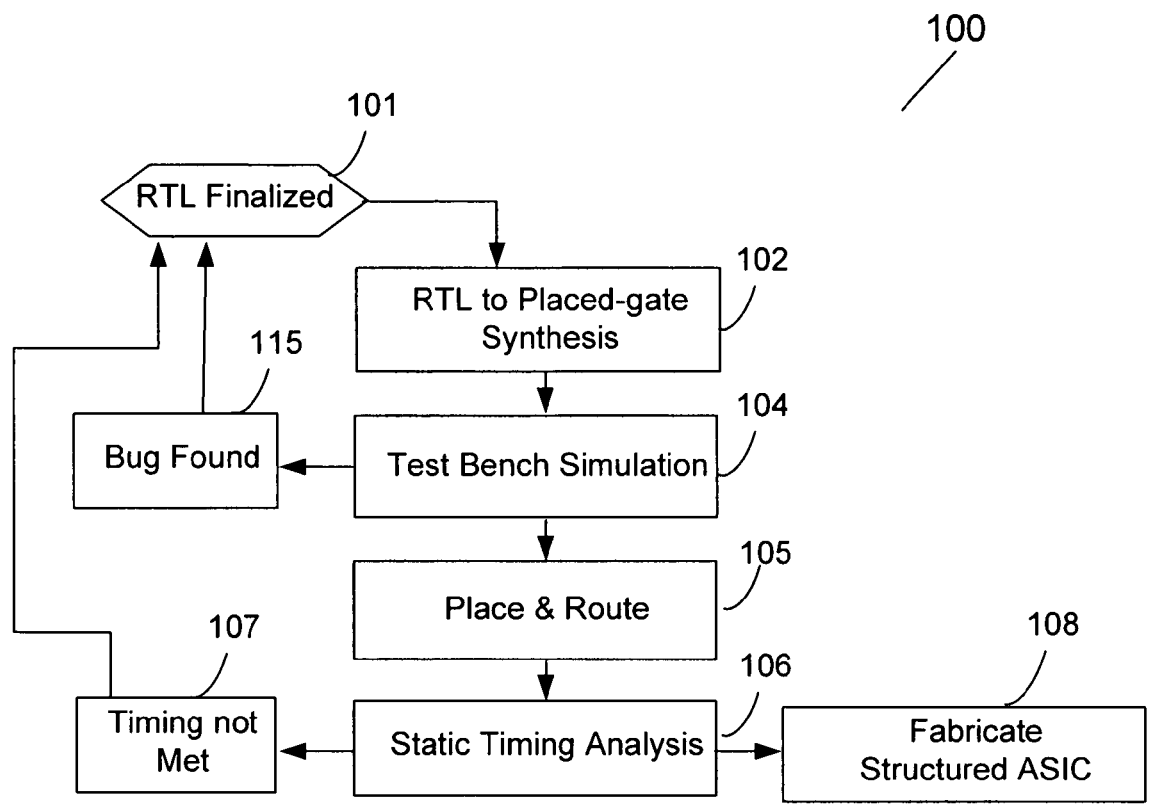
FIG. 1 is a conventional process flow for developing designs for ASIC devices.
Figure 2:
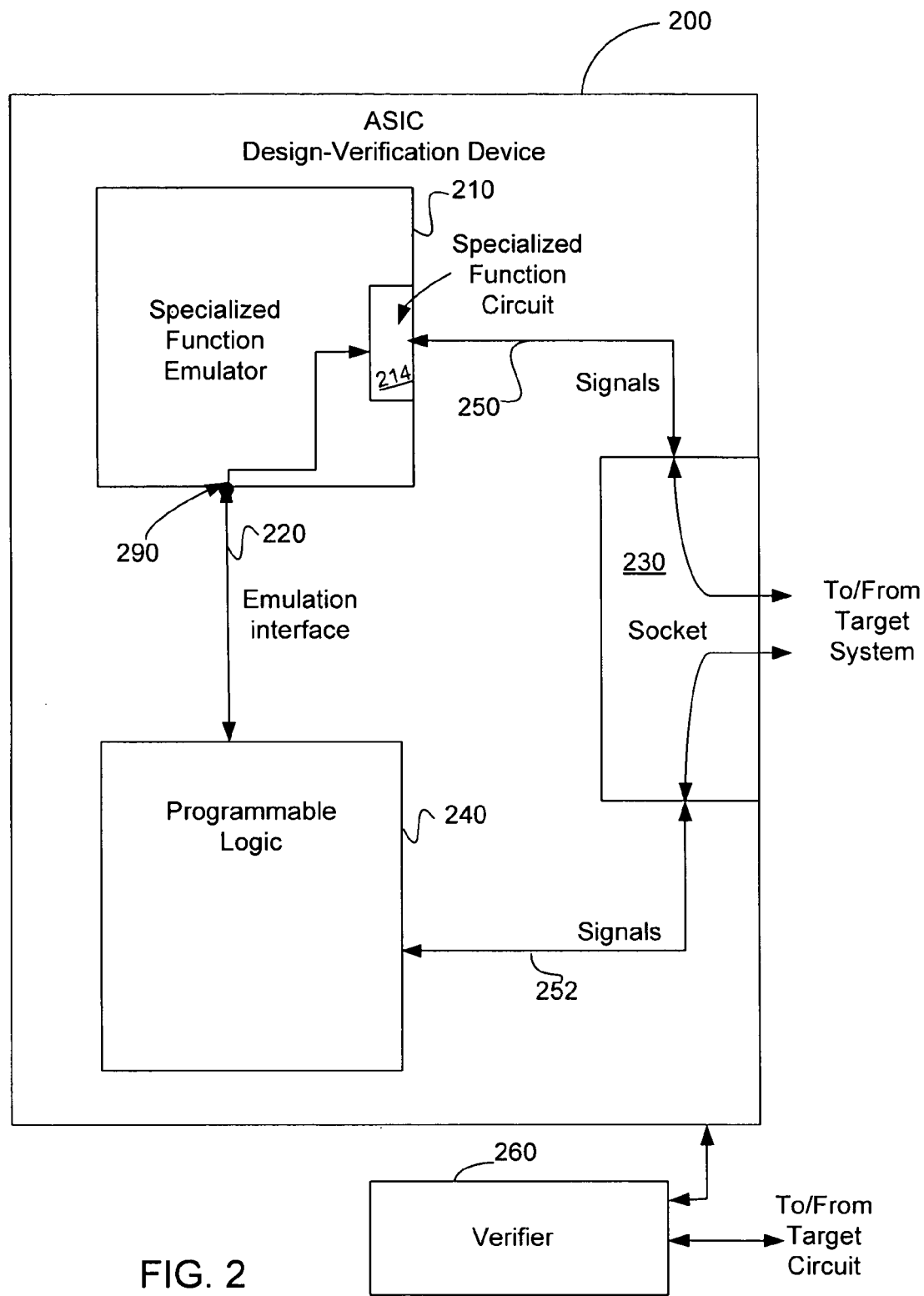
FIG. 2 is a block diagram depicting an in-circuit design and verification device configured to emulate an ASIC and its logical and specialized functions, according to another embodiment of the invention.

FIG. 2 is a block diagram depicting the use of an in-circuit design and verification system to emulate specialized functions of an application-specific integrated circuit, according to at least one specific embodiment of the invention. Advantageously, in-circuit design and verification system ("system") 200 facilitates real-time and interactive design and verification functions to cooperatively debug a circuit description for a design of an ASIC. In particular, the design processes and the verification processes are interleaved so as to substantially parallelize the design and verification of an ASIC device, which is unlike conventional design and verification. Normally, the design and verification of a traditional ASIC are performed in series. Accordingly, in-circuit design and verification system 200 can be programmed to include initial logic and then inserted into a target application for verification and iterative design of the ASIC. In some embodiments, in-circuit design and verification system 200 replaces software-based simulator testing, thereby expediting the time to manufacture ASICs. The term ASIC includes standard cell ASICs, structured ASICs and full custom ASICs implementations, among others.

In-circuit design and verification system 200 includes a special function emulator 210 and programmable logic 240, both of which cooperate to emulate the specialized and logical function of an ASIC in a target system (not shown). As used in some embodiments, the term "specialized function circuit" refers to analog circuits and/or mixed-signal circuits (i.e., mixed analog and digital circuits), none of which can generally be emulated by digital logic circuits alone. An emulator interface 220 couples programmable logic 240 to specialized function circuit 214 to facilitate communications for activating a special function and/or for coordinating the application of signals from programmable logic 240 and/or specialized function circuit 214 to the target system. By examining the responses from the target system, a designer then can more accurately predict the behavior of the logic after the designer implements it as on-chip logic (i.e., after fabrication) within an ASIC device (not shown). Also, the term programmable logic can be referred to in some embodiments as configurable logic.

Advantageously, in-circuit design and verification system 200 reduces errors that otherwise would be transferred into on-chip logic. Specifically, in-circuit design and verification system 200 detects errors that are not generally detectable by conventional techniques for verifying designs of ASIC devices, such as those techniques that include the use of traditional software-based simulators. Also, in-circuit design and verification system 200 can emulate the specialized (i.e., non-logical) functionality of specialized function circuit 214 that programmable logic 240 cannot emulate. Further, in-circuit design and verification system 200 also provides an improved design and verification flow, for example, prior to fabricating the ASIC, thereby minimizing risks of committing resources, such as NRE costs and cycle time, to reap the benefits of ASIC devices. In addition, emulator interface 220 verifies cooperative communications between specialized function circuit 214 and programmable logic 240 to emulate communications usually pass during run mode between on-chip logic and the special circuit. Emulation of a run time interface is beneficial, in whole or in part, to predict how the specialized functions will behave in a post-fabricated ASIC.

During in-circuit design and verification, signals over emulator interface 220 activate specialized function circuit 214 so that it can perform a specialized function, which enables a target system to respond. Both configurable logic 240 and specialized function circuit 214 then interact with the response from the target system. Activation via emulator interface 220 facilitates detection of faults in the function and/or structure of emulator interface 220, thereby predicting faults that might arise in a run mode interface after the ASIC is formed. In at least one embodiment, a verifier 260 is configured to monitor the response of the target to determine whether the response from the target system matches an expected response. If it does, then the logic in configurable logic 240 is executing properly. This also means that configurable logic 240 is properly interacting with specialized function circuit 214. But if verifier 260 determines the target system result does not match an expected response, then verifier 260 generates an indication that an error is present. Then, a designer can debug, for example, the logic of configurable logic 240 and reconfigure it to rectify the response. The process of debugging the logic contained in the configurable logic 240 continues until errors are eliminated. In one embodiment, verifier 260 is a human having sufficient knowledge to detect errors and to modify the logic to eliminate the errors. In another embodiment, verifier 260 is an automated computer-based system configured to detect errors, modify the logic to rectify the errors and reconfigure the programmable logic to cause in-circuit design and verification system 200 to behave in accordance to the modified logic. In one embodiment, verifier 260 is a computing device operating in accordance with known verification techniques to confirm whether a target system response is as what has been either synthesized or expected (i.e., it conforms with a specific standard or specification).

Once a designer thoroughly exercises configurable logic 240 and/or specialized function circuit 214 sufficiently to predict the functionality of a fabricated ASIC, then the designer can port the logic from configurable logic 240 to on-chip logic 352 during manufacture of an ASIC.

In-circuit design and verification system 200 is configured to emulate an ASIC and its logical and specialized functions, according to another embodiment of the invention. In-circuit design and verification device 200 includes a specialized function emulator 210, programmable logic 240 and socket 230, and it operates to emulate the functionalities an ASIC (not shown) that includes the logic emulated in programmable logic 240. Programmable logic 240 and specialized function emulator 210 cooperate to collectively emulate an ASIC. In a specific embodiment, programmable logic 240 includes logic that functions as if it were on-chip logic of an ASIC. In some embodiments, programmable logic 240 can include a Field-Programmable Gate Array ("FPGA") formed as a single integrated circuit. Specialized function emulator 210 includes specialized function circuit 214 to emulate a specialized function that programmable logic 240 cannot emulate. As such, specialized function emulator 210 facilitates compliance with predetermined metrics, such as those defined by compliance tests. In operation, specialized function emulator 210 generates signals 250 and programmable logic 240 generates other signals 252. Collectively, signals 250 and 252 interface via socket 230 to a target system (not shown) to emulate an ASIC device. Note that in-circuit design and verification device 200 can include a printed circuit board ("PCB") for providing conductors for carrying signals via socket 230 to the target system. Note that socket 230 can be any external input/output ("I/O") interface for coupling signals between a target system and in-circuit design and verification device 200.

In one embodiment, specialized function circuit 214 is formed in an integrated circuit, which resides on a substrate separate from another substrate upon which programmable logic 240 is formed. In various embodiments, specialized function circuit 214 is configured to perform a non-logical function, which is a term describing functions and operational characteristics that cannot be emulated or duplicated by programmable logic 240. In various embodiments of the invention, specialized function circuit 214 can include, but is not limited to: a Peripheral Component Interconnect Express ("PCI Express") circuit; a Universal Serial Bus ("USB") circuit (operating in accordance with a USB standard); a Serial Advanced Technology Attachment ("SATA") circuit (functioning according to a SATA standard); analog-to-digital conversion circuits ("A-to-D converters"), digital-to-analog conversion circuits ("D-to-A converters"), and any other analog or mixed signal interface (as structures performing non-logical functions) that the logic in FPGAs generally cannot support. In some cases, an entity developing specialized function circuit 214 mandates compliance testing of any AASIC device that adopts such a specialized function circuit. For quality control purposes, specialized function circuit 214 is tested against a specification composed of a number of operating parameters, which include, for example, operating speeds, voltage levels, signal timing, etc. According to a specific embodiment of the invention, compliance testing can be performed on specialized function circuit 214, thereby testing specialized function circuit 214 prior to fabrication of the ASIC device. By doing so, the specialized circuit is certified prior to its use within in-circuit design and verification device 200. Thus, a designer using the in-circuit design and verification device 200 can utilize a design that already is in compliance.

Specialized function circuit 214 includes an emulation interface 220 configured to supply emulated interface signals, including control signals, between programmable logic 240 and specialized function emulator 210. Specialized function emulator 210 also includes an emulation port 290 for receiving and transmitting signals. As such, interface 220 emulates the use of run-time interface signals being exchanged between on-chip logic of an ASIC (not shown) and specialized function circuit 214. Specialized function circuit 214 also includes an input port for receiving and transmitting signals during in-circuit design and verification.

In operation, programmable logic 240 generates logic-generated ("LG") signals 252 and applies them to a target system. Programmable logic 240 also generates emulated interface signals for transport via emulation interface 220 to specialized function circuit 214 to activate its specialized function, which in turn, generates signals 250 bound for the target system. Programmable logic 240 and specialized function emulator 210 therefore cooperate to invoke responses from the target system during in-circuit design and verification, according to various embodiment of the invention. Further, in-circuit design and verification device 200 can be configured to determine whether the responses are proper (e.g., they are as expected) to confirm that the logic of programmable logic 240 interacts properly with the embedded specialized function circuit 214. But if the responses are improper, then in-circuit design and verification device 200 can be configured to resolve the improper response by reconfiguring or modifying, for example, logic in programmable logic 240. Reconfiguring the logic, in turn, modifies a subset of the emulated interface signals to rectify operation of specialized function circuit 214 to reduce or eliminate the improper responses. This decreases the amount of errors that otherwise can carry over into on-chip logic of an ASIC during fabrication.

Figure 3:
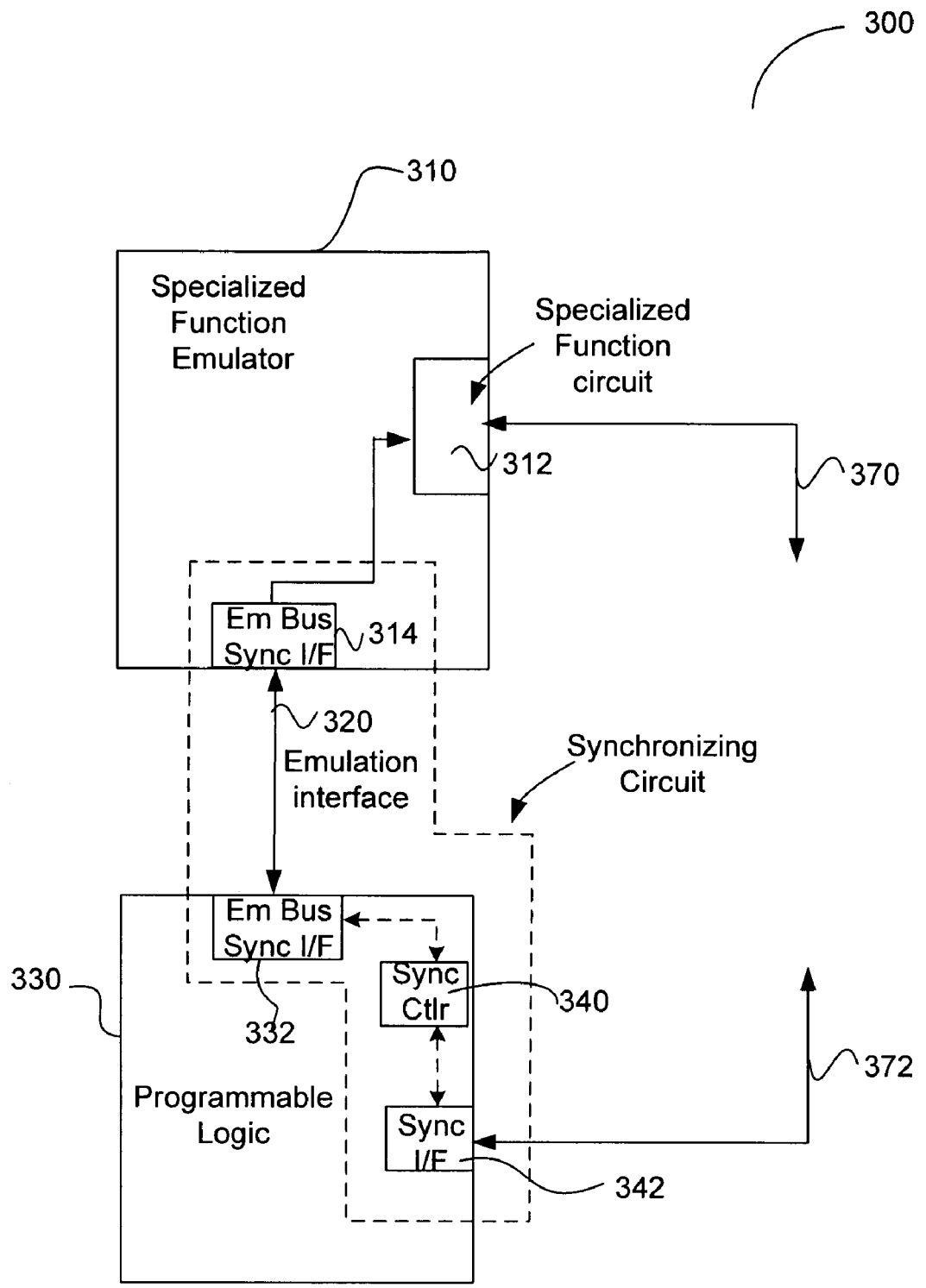
FIG. 3 is a block diagram depicting a synchronizer circuit to facilitate proper operation of an emulation interface, according at least one embodiment of the invention.

FIG. 3 is a block diagram depicting a synchronizer circuit to facilitate proper operation of an emulation interface, according at least one embodiment of the invention. The portion 300 of an in-circuit design and verification device is shown to encompass a specialized function emulator 310, which includes a specialized function circuit 312, and a programmable logic 330. Specialized function emulator 310 and programmable logic 330 have similar functionalities and/or structures to similarly named elements in FIG. 2. In one embodiment, programmable logic 330 has similar functionalities and/or structures as configurable logic 240 (FIG. 2). Portion 300 of the in-circuit design and verification device also includes a synchronizing circuit 302 to at least synchronize signals passing over emulation interface 320 to ensure deterministic timing between programmable logic 330 and specialized function emulator 310. Since emulation interface 320 has a length longer than the run-time interface 360, synchronizing circuit 302 is implemented to synchronize data transfer between two chips. In particular, emulation interface 320 is a parallel bus that, due its length, might cause skewed timing on some bus lines. To resolve the mismatches in timing, synchronizing circuit 302 includes emulation bus synchronizer interfaces ("Em Bus Sync I/F") 314 and 332. These emulation bus synchronizer interfaces operate to re-time the emulated interface signals to coincide with each other in parallel. In at least one embodiment, emulation bus synchronizer interfaces 314 and 332 implement flip-flops and/or registers to re-time those signals to reduce timing variations. In some cases, emulation bus synchronizer interfaces 314 and 332 introduce a delay of about a clock cycle, which is sufficient for all signals in the parallel bus to cross emulation interface 320. Optionally, programmable logic 330 includes a synchronizer controller ("sync ctlr") 340 and a logic synchronizer interface ("synch I/F") 342 to ensure delays in applying nonlogic-generated signals 370 to a target system are compensated with re-timing of logic-generated signals 372 between programmable logic 330 and the target system. Synchronizer controller 340 therefore synchronizes the application of signals 372 and 370 to ensure they properly arrive at the target system regardless of the delays associated with transferring emulated interface signals.

Figure 4:
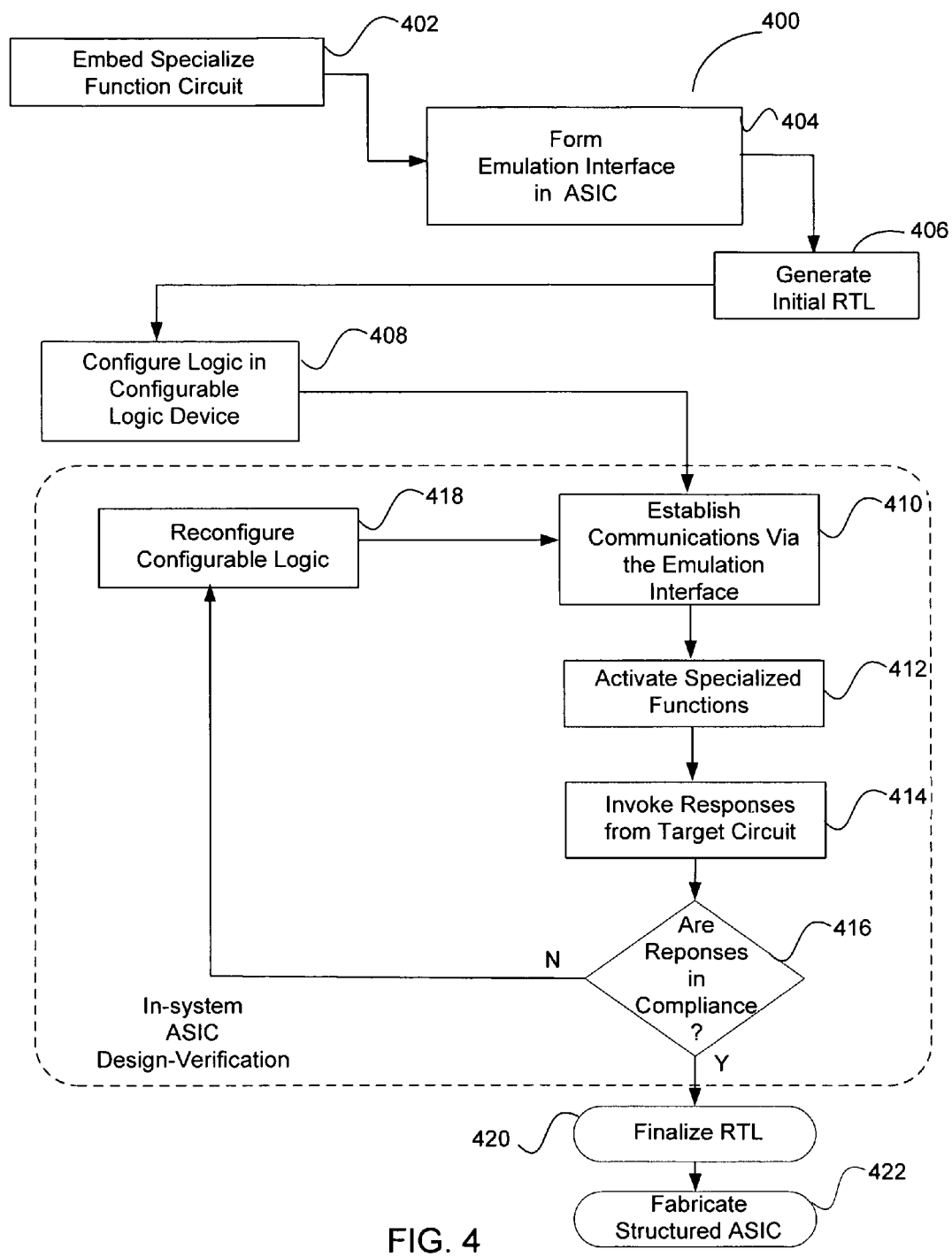
FIG. 4 is a flow for emulating logical and specialized functions to cooperatively design and verify circuits for an ASIC, according to one embodiment of the invention.

FIG. 4 is a flow for emulating logical and specialized functions to cooperatively design and verify circuits for an ASIC, according to one embodiment of the invention. Flow 400 includes forming or embedding a specialized function circuit within an ASIC at 402. Optionally at 402, flow 400 can include performing compliance testing for the specialized function circuit to confirm that it complies with set of performance or operational metrics. For example, consider that the specialized circuit is a PCI PHY interface. Then at 402, flow 400 provides compliance testing for the PCI PHY interface to verify that it behaves according to a PCI standard (e.g., a PCI Express standard). At 404, an emulation interface is established in an ASIC. Then, after a designer generates an initial description (e.g., initial RTL) at 406 of the logic to be emulated, a configurable logic device can be configured at 408 to emulate the logical functions of an ASIC. Initial RTL at 406 represents a circuit description that has yet been verified using an in-circuit design and verification device, according to at least one embodiment of the invention.

During in-system ASIC design and verification, the configurable logic establishes communications via the emulation interface at 410 to, for example, activate a specialized function at 412. The activation of the specialized function then applies specialized function signals to a target system to invoke one or more responses from a target system at 414. Continuing with the previous example, consider that the PCI PHY interface can transmit requests via a PCI bus to a central processing unit ("CPU") or a peripheral device. At 416, flow 400 determines whether one or more responses from the CPU or peripheral devices conform with expected results, such as those defined by a specification. If the responses do not comply, a designer can reconfigure the logic of the programmable logic at 418 to try to invoke a compliant response from the target system. If the responses do comply, then the interaction between the specialized function circuit and configurable logic can sufficiently perform as desired in a target system. Once the logic has been verified and iteratively designed (i.e., debugged), the circuit description for the ASIC is finalized at 420. The ASIC is then fabricated at 422 having been verified after iteratively design the logic to behave properly in the target system.

Figure 5:
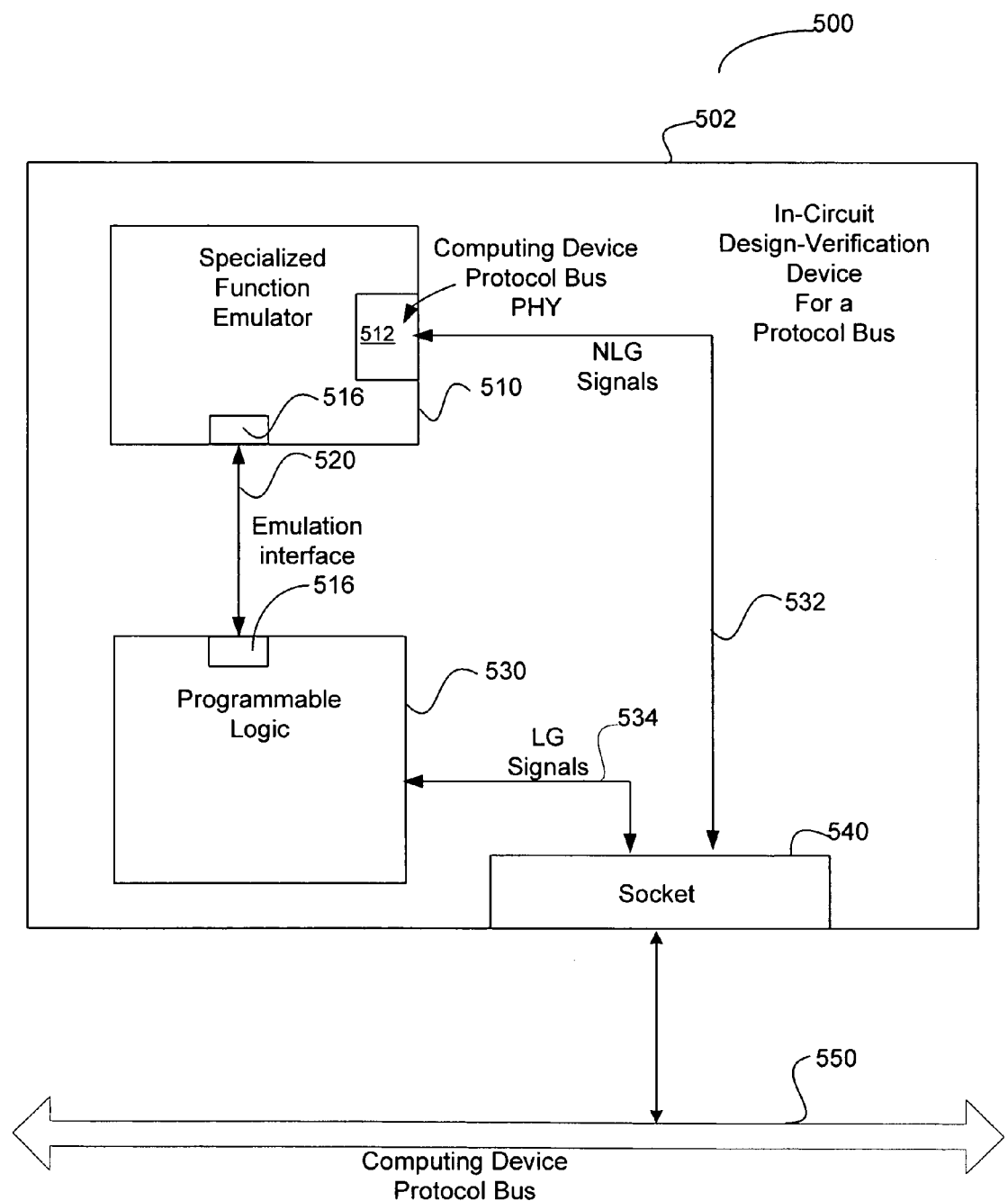
FIG. 5 is a block diagram depicting an in-circuit design and verification device for emulating an ASIC designed to control communication with a bus and its specific bus protocol, according to one embodiment of the invention.

FIG. 5 is a block diagram depicting an in-circuit design and verification device for emulating an ASIC designed to control communication with a specific bus protocol, according to one embodiment of the invention. In-circuit design and verification device 500 includes a board 502 (or some other substrate) couples a specialized function emulator 510, a programmable logic 530 and a socket 540 to each other. Specialized function emulator 510 and programmable logic 530 can have equivalent functionalities and/or the structures to similarly named elements described herein. Board 502 includes conductors for implementing emulation interface 520, a nonlogic signal path 532 and logic signal path 534. Paths 532 and 534 respectively carry specialized function signals and logic function signals.

In one embodiment, in-circuit design and verification device 500 is configured to emulate an ASIC device that, when fabricated, combines a PCI PHY interface and a PCI bus controller in a single device. For purposes of emulating this ASIC, programmable logic 530 is configured to implement the PCI bus controller in the logic of a Field-Programmable Gate Array ("FPGA"). Generally, the FPGA should be able to emulate the following: logical functions, embedded memory (e.g., embedded RAM) functions, general purpose I/O functions, phase-locked loop ("PLLs") functions, memory interface functions (e.g., DDR) and other like functions, all of which can be implemented in an ASIC. Further, specialized function emulator 510 is configured to implement a PCI PHY interface as a specialized function circuit ("computing device protocol bus PHY") 512. In one instance, computing device protocol bus 550 is a target system with which in-circuit design and verification device 500 mates.

In the ASIC, the interface (not shown) between on-chip logic and specialized function circuit 512 generally operates on a common core clock domain whose skew is controlled to avoid timing problems, such as variability in signal arrivals. But when the PCI PHY interface and PCI bus controller are implemented in separate devices, possible timing problems can arise in emulation interface 520. In a specific embodiment, in-circuit design and verification device 500 uses emulation interface synchronizers 516 to provide re-timing registers. Each re-timing register can be configured to have a unique special phase offset to synchronize each parallel emulated interface signal with the others traversing emulator interface 520. Consequently, emulation interface synchronizers 516 facilitate emulation of the interface during in-circuit design and verification. In some embodiments, the FPGA of programmable logic 530 receives its core operating clock from specialized function emulator 510 because the PCI PHY interface requires a low jitter clock source and local PLL, both of which can be emulated as being part of specialized function circuit 512.

Figure 6:
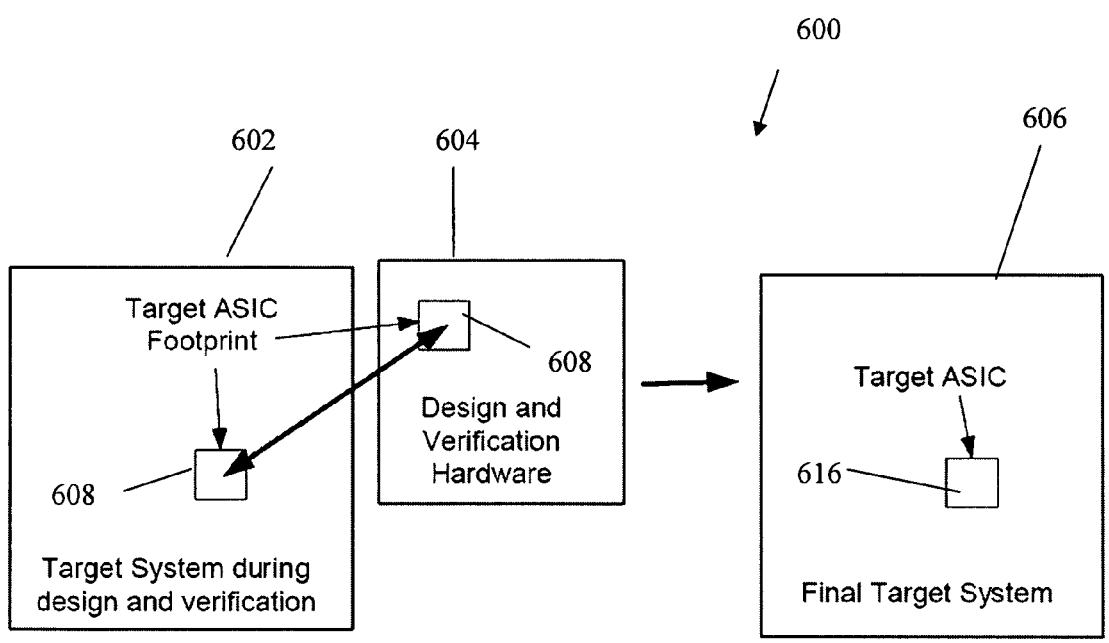
FIG. 6 is a pictorial representation of an arrangement of hardware and the process of using it, according to an embodiment of the invention.

FIG. 6 is a pictorial representation of an arrangement of hardware and the process of using it, according to an embodiment of the invention. Design and verification system ("hardware") 604 is used to refine the design until the performance at the system level is correct. Advantageously, an external input/output ("I/O") interface for the design and verification system 604 is compatible with the footprint 608 of a target ASIC that is to be mounted on the system PCB of the target system 602. This compatibility facilitates the exchange of signals between design and verification system 604 and target system 602, such as during design and verification. The term footprint generally refers to the pattern and space on a board taken up by a component, the pattern usually being defined by soldering pads for mounting the target ASIC to a PCB. As used herein, the term "target ASIC" refer in some embodiments to ASIC for which the design and verification is being performed. After the design has been verified to be complete and correct, the target ASIC 616 is fabricated and assembled on the system PCB of the final target system 606, generally with a relatively high degree of confidence that it will work correctly.

The foregoing description, for purposes of explanation, used specific nomenclature to provide a thorough understanding of the invention. However, it will be apparent to one skilled in the art that specific details are not required in order to practice the invention. In fact, this description should not be read to limit any feature or aspect of the invention to any embodiment; rather features and aspects of one embodiment may readily be interchanged with other embodiments. For example, although the above descriptions of the various embodiments relate to emulating an ASIC, the discussion is applicable to emulating other technologies.

Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications; they thereby enable others skilled in the art to best utilize the invention and various embodiments with various modifications as are suited to the particular use contemplated. Notably, not every benefit described herein need be realized by each embodiment of the invention; rather any specific embodiment can provide one or more of the advantages discussed above. It is intended that the following claims and their equivalents define the scope of the invention.

The invention claimed is:

1. An in-circuit design and verification system for emulating an application-specific integrated circuit ("ASIC"), said in-circuit design and verification system comprising:
   programmable logic configured to emulate circuitry of said ASIC;
   a specialized function circuit configured to emulate a specialized function, wherein said specialized function circuit is selected from the group consisting of a Peripheral Component Interconnect (PCI) Express circuit, an Universal Serial Bus (USB) circuit, and a Serial Advanced Technology Attachment (SATA) circuit; and
   an emulation interface configured to provide control signals from said configured programmable logic to said specialized function circuit during an in-circuit design and verification,
   wherein said configured programmable logic and said specialized function circuit cooperate to emulate said ASIC.

2. The method of claim 1 wherein said in-circuit design and verification system is configured to detect an error in the design of said ASIC arising from said in-circuit design and verification system interacting with a target system.

3. The method of claim 2 wherein said error results from a flaw in logic within said configured programmable logic, said flaw causing said control signals to generate an improper response from said specialized function circuit to said target system.

4. The in-circuit design and verification device system of claim 1 wherein said emulation interface further comprises an emulation synchronizer to at least synchronize arrival of said control signals from said programmable logic to said specialized function circuit.

5. The in-circuit design and verification device system of claim 1 wherein said configured programmable logic includes a Field-Programmable Gate Array ("FPGA") and said on-chip logic includes arrays of logic being programmable to include said logic from said programmable logic after emulating said ASIC.

6. The in-circuit design and verification device system of claim 1 wherein said specialized function circuit is certified to comply with a specification composed of a plurality of operating parameters prior to coupling said in-circuit design and verification system to a target system.

7. The in-circuit design and verification device system of claim 1 wherein said configured programmable logic is formed on a first integrated circuit and said specialized function circuit is formed on a second integrated circuit.

8. The in-circuit design and verification device system of claim 1 further comprising an external input/output ("I/O") interface for coupling signals between said in-circuit design and verification system and a target system, wherein said external input/output interface is compatible with a footprint for said ASIC.

9. An in-circuit design and verification system for emulating an application-specific integrated circuit ("ASIC"), said in-circuit design and verification system comprising:
   programmable logic configured to emulate circuitry of said ASIC;
   a specialized function circuit configured to emulate a specialized function that said programmable logic cannot emulate, wherein said specialized function circuit is selected from analog-to-digital conversion circuits ("A-to-D converters"), digital-to-analog conversion circuits ("D-to-A converters"), analog circuits, and mixed analog and digital circuits ("mixed-signal"); and
   an emulation interface configured to provide control signals from said configured programmable logic to said specialized function circuit during an in-circuit design and verification,
   wherein said configured programmable logic and said specialized function circuit cooperate to emulate said ASIC.

10. A method for forming an in-circuit design and verification system for iteratively designing and verifying application-specific integrated circuit devices, said method comprising:
    specifying configurable logic and an ASIC device, said ASIC including a specialized function circuit and an emulation port;
    forming an emulation interface to couple said configurable logic via said emulation port to said specialized function circuit, said emulation interface being configured to exchange interface signals between said configurable logic and said specialized function circuit via said emulation port during an in-circuit design and verification mode,
    wherein said configurable logic and said specialized function circuit are configured to cooperatively emulate the functionality of another ASIC fabricated with a specialized function common to said ASIC; and
    wherein said specialized function circuit is a Peripheral Component Interconnect (PCI) Express circuit.

11. The method of claim 10 further comprising fabricating said ASIC device including:
forming an input port in said ASIC device to convey said interface signals to said specialized function circuit during said in-circuit design and verification mode.

12. The method of claim 10 further comprising forming signal paths between an external input/output ("I/O") interface and said configurable logic and said specialized function circuits, said forming signal paths including:
establishing one or more signal paths between said specialized function circuit and a first subset of external ports for said external input/output interface; and
establishing one or more signal paths between said configurable logic and a second subset of external ports for said external input/output interface,
wherein said first and second subsets provide signals and to a target system.

13. A method for emulating an embedded specialized function circuit for an application-specific integrated circuit ("ASIC") device, said embedded specialized function circuit being formed in said ASIC, the method comprising:
configuring logic to initiate a specialized function of said embedded specialized function circuit to generate a response by a target system; and
verifying whether said response from said target system matches an expected response,
wherein said logic is configurable to alter said response to match said expected responses and
wherein said specialized function circuit is a Universal Serial Bus (USB) circuit.

14. The method of claim 13 further comprising determining said response matches said expected response, thereby reducing errors that said logic otherwise introduces into said ASIC.

15. The method of claim 14 further comprising:
generating a description of said logic; and
forming said logic to fabricate said ASIC device,
wherein said description includes a hardware design language ("HDL").

16. The method of claim 13 further comprising forming an interface between said logic in a first integrated circuit and said embedded specialized function circuit in a second integrated circuit.

17. The method of claim 16 further comprising synchronizing emulated signals in said interface to reduce timing variations.

18. A method for emulating application-specific integrated circuits ("ASICs") with an embedded specialized function circuit, the method comprising:
configuring programmable logic to form logic to generate emulated logic signals and to generate interface signals between said configured programmable logic and said embedded specialized function circuit, said configured programmable logic being formed separate from said integrated circuit;
generating specialized function signals in response to said emulated logic signals; and
applying said specialized function signals and said emulated logic signals to a target system,
wherein said configured programmable logic and said embedded specialized function circuit cooperate to invoke responses from said target system;
wherein said specialized function circuit is a Serial Advanced Technology Attachment (SATA) circuit.

19. The method of claim 18 further comprising determining said responses are proper responses to confirm that said configured programmable logic interacts properly with said embedded specialized function circuit.

20. The method of claim 19 wherein determining said responses are proper responses further comprises eliminating errors when forming logic in said ASIC based on said configured programmable logic.

21. The method of claim 18 further comprising certifying said embedded specialized function circuit complies with a specification composed of a plurality of operating parameters prior to using said function to emulate said ASICs, thereby foregoing a requirement for subsequent compliance testing.

22. The method of claim 18 further comprising forming an interface between said configured programmable logic and said embedded specialized function circuit, wherein said interface provides for in-circuit design and verification of said embedded specialized function circuit in said ASIC within the target system.

23. The method of claim 22 further comprising synchronizing said emulated interface signals over said interface to make the timing predictable.

24. The method of claim 18 further comprising exercising said configured programmable logic and said embedded specialized function circuit without using a software-based simulator as said target system, thereby detecting faults that otherwise are difficult to detect by said software-based simulator.

25. The method of claim 18 wherein said ASIC is a structured ASIC.

26. The method of claim 18 further comprising: A method for emulating application-specific integrated circuits ("ASICs") with an embedded specialized function circuit, the method comprising:
configuring programmable logic to form logic to generate emulated logic signals and to generate interface signals between said configured programmable logic and said embedded specialized function circuit, said configured programmable logic being formed separate from said integrated circuit;
generating specialized function signals in response to said emulated interface signals;
applying said specialized function signals and said emulated logic signals to a target system, wherein said configured programmable logic and said embedded specialized function circuit cooperate to invoke responses from said target system;
determining that a response from said responses is an improper response;
reconfiguring said configured programmable logic to form reconfigured programmable logic to modify a subset of said emulated interface signals from said emulated interface signals; and
resolving said improper response due to said subset of said emulated interface signals, thereby decreasing an amount of errors when forming said ASIC based on said configured programmable logic.

27. A method for emulating application-specific integrated circuits ("ASICs") with an embedded specialized function circuit, the method comprising:
configuring programmable logic to form logic to generate emulated logic signals and to generate interface signals between said configured programmable logic and said embedded specialized function circuit, said configured programmable logic being formed separate from said integrated circuit;

generating specialized function signals in response to said emulated interface signals; and applying said specialized function signals and said emulated logic signals to a target system, wherein said configured programmable logic and said embedded specialized function circuit cooperate to invoke responses from said target system; and conforming said response to a specification composed of a plurality of operating parameters; wherein said plurality of operating parameters constitute one or more of the following: a Peripheral Component Interconnect Express ("PCI Express") standard; a Universal Serial Bus ("USB") standard; and a Serial Attached SCSI ("SATA") standard analog-to-digital conversion circuits ("A-to-D converters"), and digital-to-analog conversion circuits ("D-to-A converters").

* * * * *